United States Patent
Soffer et al.

[11] Patent Number: 5,695,818
[45] Date of Patent: Dec. 9, 1997

[54] METHOD OF IMPROVING THE SELECTIVITY OF CARBON MEMBRANES BY CHEMICAL CARBON VAPOR DEPOSITION

[75] Inventors: Abraham Soffer, Arad; Moshe Azariah, Moshav Gilat; Abraham Amar, Omer; Haim Cohen, Beer-Sheva; Dan Golub, Omer; Shlomo Saguee; Haim Tobias, both of Beer-Sheva, all of Israel

[73] Assignees: Rotem Industries Ltd., Beer-Sheva, Israel; AGA Aktiebolag, Lidingo, Sweden

[21] Appl. No.: 701,205

[22] Filed: Aug. 21, 1996

Related U.S. Application Data

[63] Continuation of Ser. No. 516,722, Aug. 21, 1995, abandoned, which is a continuation of Ser. No. 213,157, Mar. 15, 1994, abandoned.

[30] Foreign Application Priority Data

Mar. 23, 1993 [IL] Israel ......................... 105142

[51] Int. Cl.⁶ ........................................... C23C 16/00
[52] U.S. Cl. ........................... 427/248.1; 427/249
[58] Field of Search .................. 427/248.1, 249; 423/447.1, 460; 55/68

[56] References Cited

U.S. PATENT DOCUMENTS

| | | |
|---|---|---|
| 4,685,940 | 8/1987 | Soffer et al. |
| 4,959,185 | 9/1990 | Suda ............................ 264/81 |
| 5,024,688 | 6/1991 | Oohashi et al. ............ 65/3.12 |
| 5,071,450 | 12/1991 | Cabrera et al. ............ 55/66 |
| 5,098,880 | 3/1992 | Gaffney et al. ........... 502/432 |

FOREIGN PATENT DOCUMENTS

| | | |
|---|---|---|
| 0394449 | 10/1990 | European Pat. Off. |
| 61-238 303 | 10/1986 | Japan |
| 63-295 476 | 12/1988 | Japan |
| 1-301 506 | 12/1989 | Japan |
| 2207666 | 2/1989 | United Kingdom |

*Primary Examiner*—Roy V. King
*Attorney, Agent, or Firm*—Merchant, Gould, Smith, Edell, Welter & Schmidt, P.A.

[57] ABSTRACT

A process for manufacturing carbon membranes having controlled pore sizes comprises the steps of: a) causing a stream of a pyrolysable carbon-containing gas to come into contact with a carbon membrane having a pore size and/or distribution larger than the desired pore size and/or distribution; b) raising the ambient temperature of the said membrane to or above the temperatures at which the adsorbed carbon-containing gas pyrolyzes; and c) substantially purging the atmosphere surrounding the membrane from carbon-containing gas.

9 Claims, 7 Drawing Sheets

METHOD OF IMPROVING THE SELECTIVITY OF CARBON MEMBRANES BY CHEMICAL CARBON VAPOR DEPOSITION

This is a Continuation of application Ser. No. 08/516,722, filed Aug. 21, 1995 now abandoned, which is a continuation of application Ser. No. 08/213,157, filed Mar. 15, 1994, now abandoned. Application Ser. No. 08/213,157 claims priority to Isreal application No. 015142 filed Mar. 23, 1993. Entitlement to this priority date is claimed.

FIELD OF THE INVENTION

The present invention relates to carbon membranes for gas separation. More particularly, the invention relates to a method of improving the permeability-selectivity combination of carbon membranes toward gas separation by the carbon chemical vapor deposition (CVD).

The manufacturing of carbon membranes has been described before, e.g., in U.S. Pat. No. 4,685,940 and in British Patent GB 2,207,666. However, membranes made according to the known art were produced by attempting to tailor the size of the pores by modifying them in chemical-thermo treatments which substantially only increased the size of the pores.

It has now been found, and this is an object of the invention, that it is possible to increase the selectivity of carbon membranes by closing and reopening its pores under controlled conditions.

It has further been found, and this is another object of the invention, that it is possible to manufacture carbon membranes having controlled pore sizes, by the chemical vapor deposition (CVD) of hydrocarbon gases in the pore system.

It has also been found, and this is still another object of the invention, that, by means of CVD, it is possible to produce asymmetric membranes using homogeneous (symmetric) carbon membranes as the starting membrane.

Offer objectives and advantages of the invention will become apparent as the description proceeds.

BACKGROUND OF THE INVENTION

Carbon membranes for gas separation are porous solids which may be developed so as to acquire pores of molecular dimension. If they have no pores of larger dimensions, these membranes act as molecular sieves.

As a separation membrane material, its quality is determined mainly by two properties: the permeability of the more permeable gas, and the selectivity which is the ratio between the permeabilities of the more permeable and the less permeable components of the gas mixture separated. However, when a membrane is formed from the raw (membrane) material, its wall thickness becomes as important as its permeability as a membrane material, as will be more fully explained hereinafter.

The permeability of a membrane is defined as the amount of fluid (in moles or an equivalent unit such as cc (STP) that flows through a membrane of unit thickness, per unit surface area, per unit time and per unit pressure difference. It expresses the inherent property of the membrane material indifferent of its thickness. A common permeability unit is: $cc(STP)\ cm\text{-}sec^{-1}\text{-}cm^{-2}\text{-}cm(Hg)^{-1}$.

Another unit is the "Barrer" whereas:

$1 Barrer = 10^{-10}[cc(STP)\text{-}cm\text{-}sec^{-1}\text{-}cm^{-2}\text{-}cm(Hg)^{-1}]$.

The specific flux of a fluid through a membrane is defined as the amount flowing per unit time per unit area per unit partial pressure difference of the permeate across the membrane. It dose not include the wall thickness, therefore it is of more practical value since it expresses the membrane module productivity.

The scientific flux unit is $cc(STP)\text{-}sec^{-1}\text{-}cm^{-2}\text{-}cm(Hg)^{-1}$.
The practical unit is: $liters\text{-}hour^{-1}\text{-}m^{-2}\text{-}bar^{-1}$.
The last unit will be used in what follows.

With the aid of the permeability P and flux F definitions, the relation between them is given by equation (1) below:

$$F = \frac{P}{l} \qquad (1)$$

where l is the membrane thickness.

Increasing the effectiveness of a membrane separator demands increasing both permeability and selectivity.

Unfortunately, there is always a trade-off between permeability and selectivity so that increasing permeability is made at the expense of selectivity, and vice versa. This is a very common phenomenon, and it is valid for polymer and for carbon membranes, as well.

It is therefore very important to be able to change the wall thickness ("l" in equations 1) so that it can serve as a third parameter that enables improving the specific flux through a membrane without changing either permeability or selectivity. As will be apparent to the skilled person from eq. 1, the thinner the wall, the greater is the flow through the membrane.

There are some practical limits to the membrane wall thickness. These are related mainly to mechanical qualifies such as the pressure difference rating, the handleability of the product in the course of assembling a membrane module, the shock resistance of the finished product, and to pinhole and fracture formation. It is known to fabricate the membrane wall into two layers: a coarsely porous support which provides the mechanical strength and enables practically free gas cross-flow, and a thin selective layer which takes the role of gas separation. The variable "l" in equations 1 and 2 relates therefore to the thin selective layer.

SUMMARY OF THE INVENTION

The method of manufacturing carbon membranes having controlled pore sizes according to the invention comprises the steps of:

a) causing a gas or vapor stream of pyrolysable carbon-containing molecules (referred to hereinafter as "carbon-containing gas") to come into contact with a carbon membrane having a pore size and/or distribution larger than the desired pore size and/or distribution;

b) raising the ambient temperature of the said membrane to or above the temperatures at which the adsorbed carbon-containing gas pyrolyzes;

c) substantially purging or evacuating the atmosphere surrounding the membrane from carbon-containing gas;

d) cooling the membrane.

The above-described process steps can be carried out in any order chosen from: a-b-c-d, b-a-c-d, a-b-d-c, or b-a-d-c.

In the context of the present invention the term "carbon-containing gas" is used to indicate any gas which contains the carbon element, and which can be adsorbed on the surface of the carbon membrane, and should be taken to comprise, e.g., pure gases or mixture of gases, including mixtures of a carbon-containing gas with inert, non-carbon containing gases, hydrocarbons as well as non-hydrocarbons, e.g., $C_2H_3Cl_3$. Furthermore, the word "gas"

should be construed in its amplest sense, and includes, e.g., vapors. Alternative terms used to indicate carbon-containing materials herein are: "CVD molecule" or "CVD material".

According to the process of the invention the following additional steps can be carried out, whenever required:

e) partially opening the pores by partial burn-off in the presence of oxidant;

f) checking the membrane permeability and selectivity at any selected time or temperature;

g) repeating the CVD procedure and steps e) and f), as required.

According to a preferred embodiment of the invention, the size of the carbon-containing gas molecule (the CVD material) is selected so as to permit or to prevent penetration into the pores, as desired. In one preferred embodiment of the invention a homogeneous membrane is produced by what will be termed "homogeneous CVD" by using a small, penetrating molecule, as will be more fully detailed hereinafter.

Illustrative examples of CVD materials are $CCl_3$-$CH_3$ and $(CH_3)_4C$. Of course, different molecules can be employed, depending on the particular requirements of the starting and final membrane, and the skilled engineer will be able to select appropriate CVD materials which are suitable for a specific process.

In another preferred embodiment of the invention, the homogeneous starting membrane is used to produce an asymmetric membrane. This can be done in a variety of ways, and according to one particular embodiment of the invention the asymmetric membrane is produced by using a CVD molecule that is commensurate with the pore size, so that only partial, shallow penetration of the CVD material into the pores will be effected. This is because the carbon atoms deposited on the pore walls will narrow the pore and block the way for deeper penetration of subsequent CVD molecules.

In still another preferred embodiment of the invention, the asymmetric membrane is produced by using a hydrocarbon molecule of a size which does not substantially penetrate the pore system, thereby creating an adlayer.

A preferred carbon membrane to be used in connection with the invention is a hollow fiber membrane, but it should be understood that the invention is not limited to any particular size, type or shape of membrane. Throughout the following description, hollow fiber membranes will be used, since they are the most convenient shape used for manufacturing carbon membranes.

When a hollow fiber membrane is used, and when it is desired to obtain an asymmetric membrane, in one particular embodiment of the invention, the CVD gas is applied from the bore side (inner side) of the hollow fiber, thereby creating pores having smaller sizes at the inside than at the outside of the membrane.

As will be apparent to the skilled engineer, it is possible to supply the CVD material either alone, as a pure mixture, or in a mixture with other gases, e.g., a carrier gas. This, in some instances, is advantageous, as will be more fully detailed hereinafter.

In order to clarify the following description, a number of basic procedures and considerations are detailed hereinafter.

BASIC PROCEDURES

The basic procedures of adjusting the permeabilities and selectivities are detailed in the aforementioned U.S. Pat. No. 4,685,945 and GB 2,207,666. It was shown therein that the permeability may be increased at the expense of selectivity by activation, namely controlled oxidation or burn-off of the carbon membrane. In another procedure in the same patents, it was shown that the selectivity may be increased and the permeability decreased by heating the carbon membrane in an inert atmosphere to significantly high temperatures.

It will be shown hereinafter that the CVD process provides an additional improvement in obtaining the permeability-selectivity combination over the above-mentioned two procedures.

Activation

Figure 1:
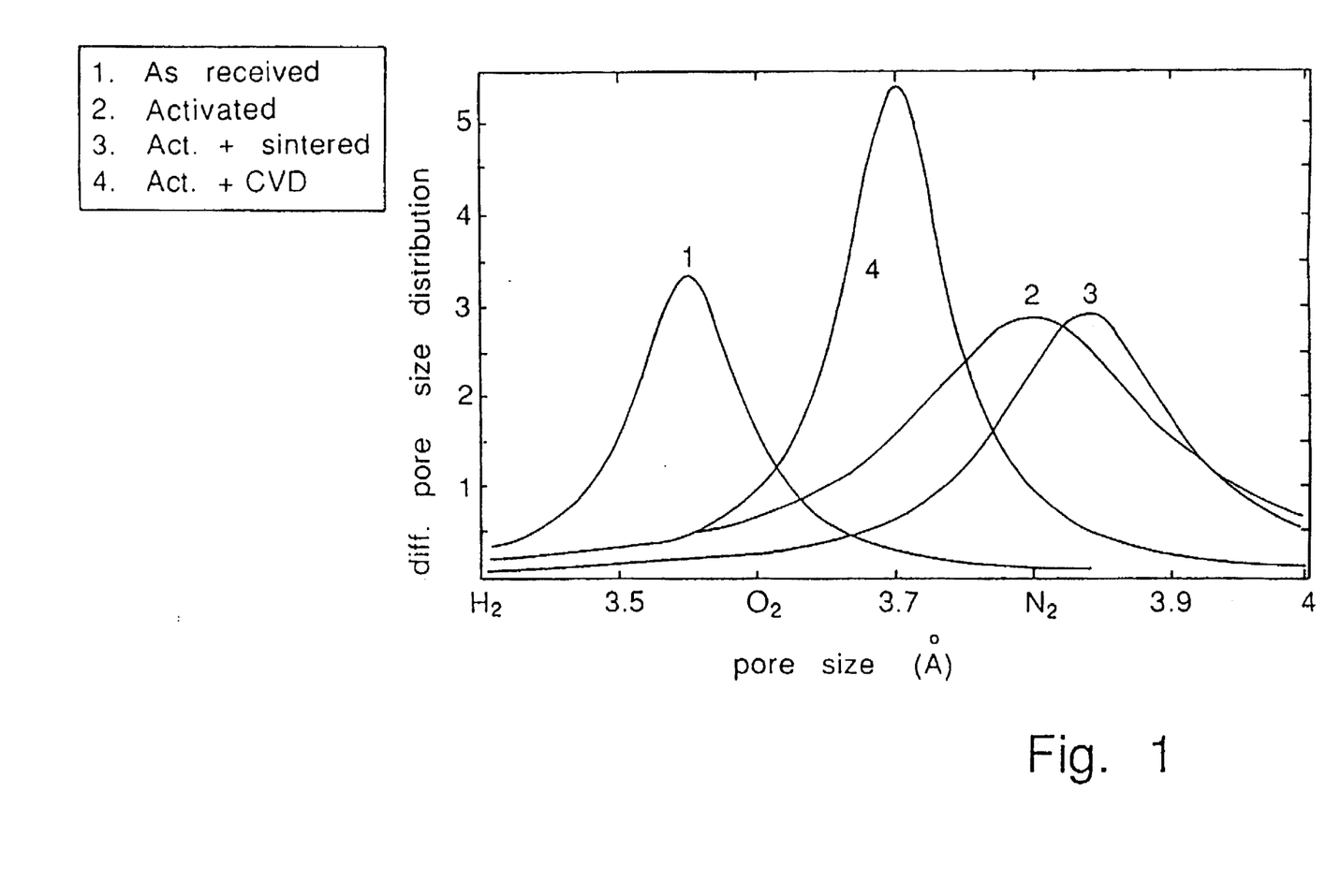
FIG. 1 is a qualitative projection of the expected form of the pore distribution function for various treated and non-treated membranes.
Figure 2:
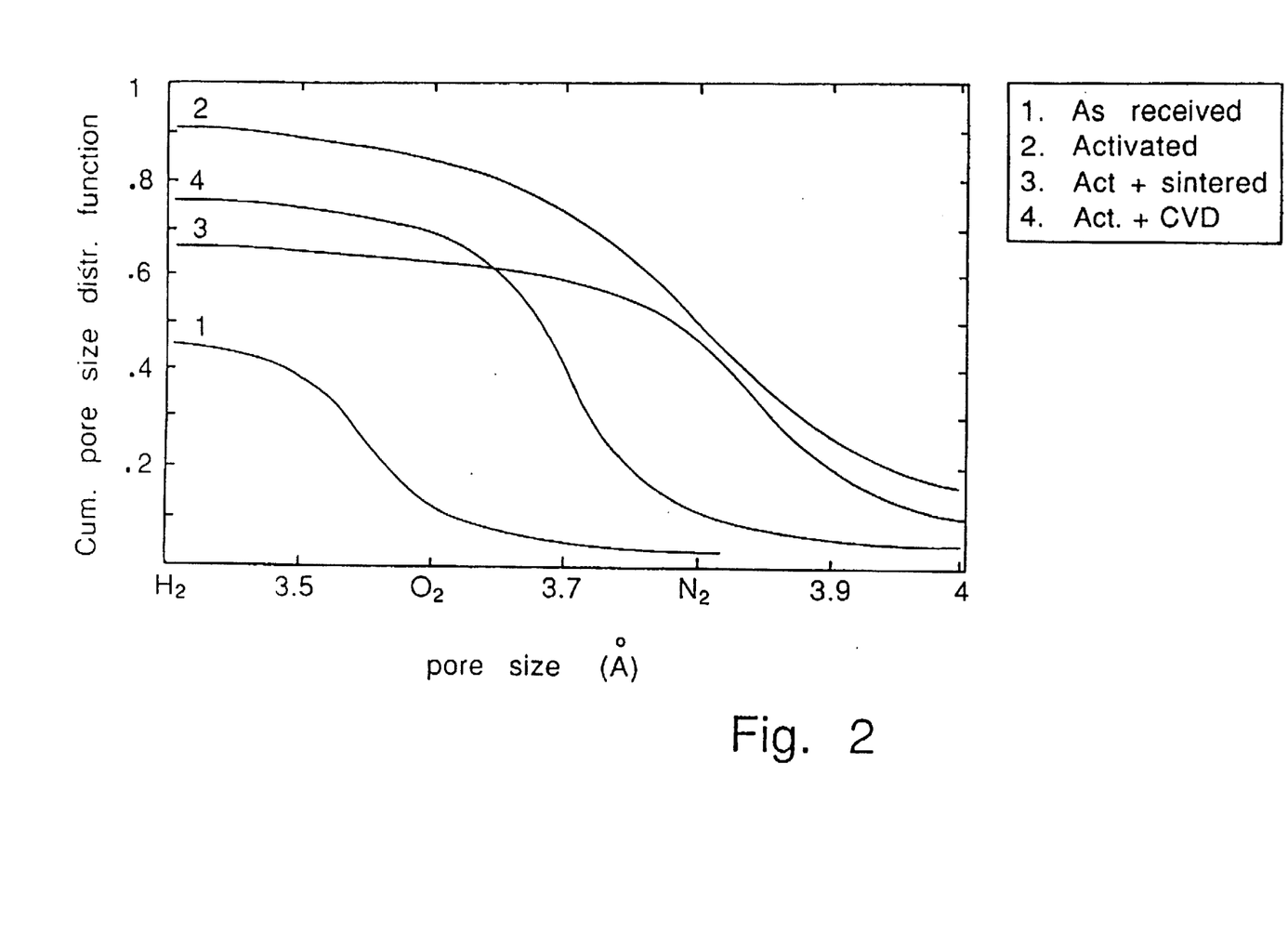
FIG. 2 is the integral form of the pore distribution function.

It is believed that the activation process increases the permeability by expelling carbon atoms from the pore walls, thus enlarging it, although the inventors do not wish to be bound by any particular theory. It is obviously understood that the permeation through larger pores is faster. The fact that this increase is gained at the expense of selectivity is shown in the two schematic pore distribution functions displayed in FIGS. 1 and 2. In each figure, curve 1 represents the prior-to-activation or as received membrane, and curve 2 the membrane after activation. FIG. 1 shows the differential pore distribution functions. These are curves showing the relative contribution of the various ranges of pore sizes to the pore volume. In FIG. 2 the integrals of the curves of FIG. 1 are presented. The integration functions are obtained starting from very large pore sizes down to the desired value, so that they show, for each pore size value at the abscissa, the total volume of pores larger than that size. As such, they denote the pore volume available for the penetration of a molecule the size of which is denoted at the abscissa. The approximate pore sizes of 3 molecules are denoted in the pore size scale. In order to gain an idea about the pore volume available for the permeation of, say, oxygen on the as-received membrane, one may consider the area under curve 1 of FIG. 1, extending to the right-hand side of the vertical line located at the oxygen molecular size. In order to gain an idea about selectivity between say, oxygen and nitrogen, one may compare the sizes of the areas which correspond to oxygen and nitrogen. These estimates are more readily made in FIG. 2, where comparisons are to be made between the height of the corresponding curves, rather than between the areas under the curves.

Keeping these facts into account, the changes in the membrane properties upon activation can be analyzed.

Prior to activation, the pore distribution function (curve 1, FIG. 1) is low, indicating low average porosity, thus low permeability to any molecule. Its maximum falls at low size values, indicating low average pore size. Furthermore, the function is sharp and falls abruptly to low values at larger pore sizes, indicating fair selectivities between large and small molecules.

After activation (curves 2 in FIGS. 1 and 2), there is both an increase in the pore volume which increases permeability, and in the average pore size, as expressed by the shift of the maximum of the pore distribution function to larger pore size values. The implication of this shift is a decrease in the selectivity, since the ratio between the pore volumes available for the smaller and the larger molecule (FIG. 2) is not as high as it was prior to activation. This illustrates the trade-off made between permeability and selectivity.

Sintering

The process of sintering is one of a decrease of the pore volume through pore collapse which proceeds preferably on the smaller pores. This preference derives from the fact that the surface energy of high curvature (small pore size) surfaces is higher, so that the contractive surface forces acting to diminish the pore walls surface and to close the pores are greater. Therefore, the smaller pores are the first to be closed off by sintering. Due to the overall pore closure there is significant decrease in the permeability as well so that if a carbon membrane is manipulated through a few steps of sintering and activation, there is a net loss in selectivity or in permeability. These changes are also illustrated in FIGS. 1 and 2, where curve 3 should be compared to curve 2. Sintering was effected by heating in an inert or reducing atmosphere to above 400° C. (typically, 800° C.), as described in Koresh and Softer, *J. Electrothem. Society*, 124, 1379(1977), and in Koresh and Soffer, *Sep. Sci. and Tech.*, 18, 723(1983).

Chemical Vapor Deposition

Figure 6:
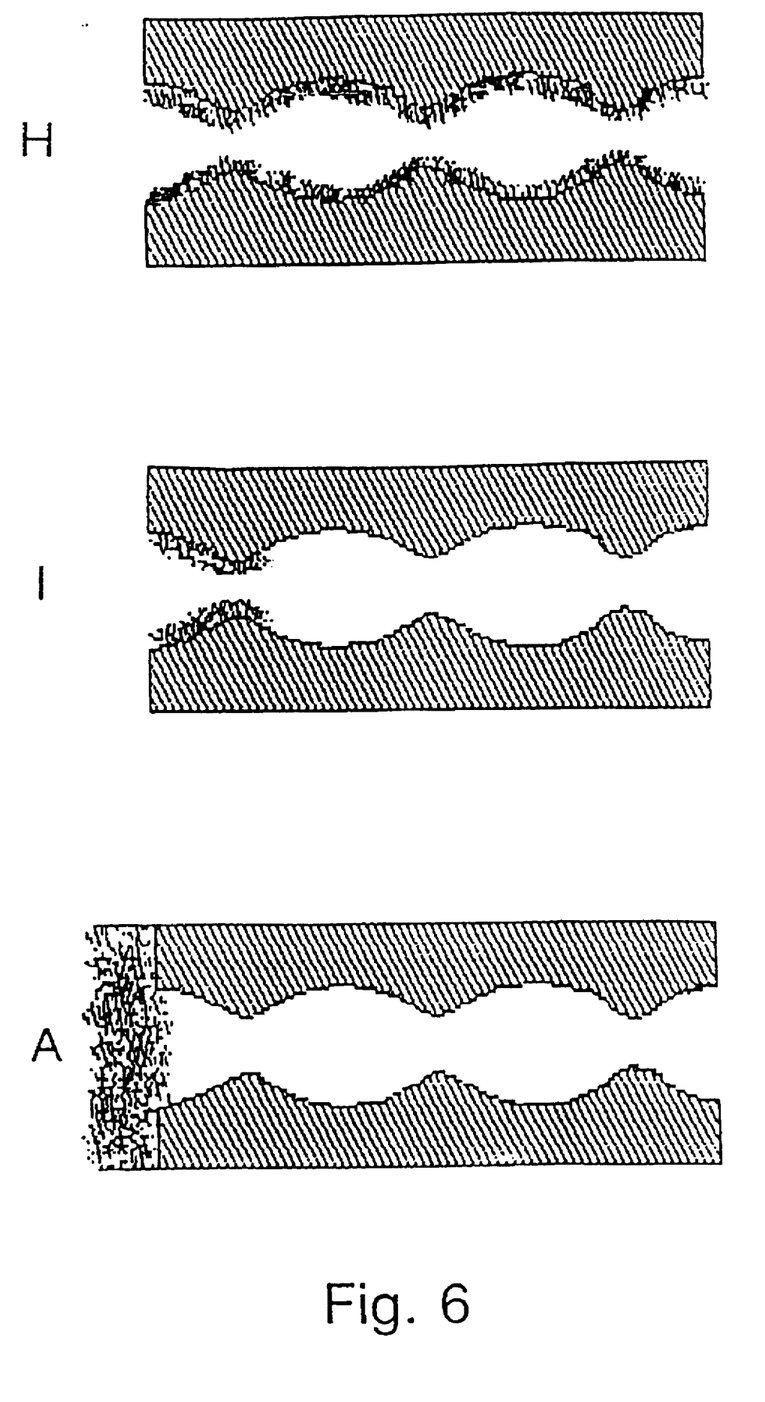
FIG. 6 is a schematic representation of three different results obtainable by chemical vapor deposition onto a carbon membrane.

The carbon chemical vapor deposition onto a carbon membrane may bring about three distinct results, as schematically illustrated in FIG. 6:

(i) homogeneous deposition of carbon into the molecular sieve pores leading to a homogeneous closure of the pore system throughout the whole depth of the membrane wall (indicated as "H" in FIG. 6);

(ii) carbon deposition into the molecular sieve pores but to a limited depth which creates a dense layer at the membrane wall surface which is part of the original membrane thickness. This layer is called an "inlayer", which should be distinguished from the "adlayer" of case (iii) (indicated as "A" in FIG. 6).

(iii) The creation of an adlayer on the membrane surface (indicated as "A" in FIG. 6).

In practice, the three modes need not necessarily be completely distinct. Thus, there may be an adlayer on top of the inlayer (mixing modes iii and ii) or some deposition in depth in addition to the inlayer (mixing modes i and ii).

Homogeneous Deposition

The homogeneous deposit decreases the permeability and increases the selectivity. However, if a properly large molecule serves as the source of carbon in the CVD process, it may not be able to enter the smaller pores so that the closure of larger pores will be preferred. The permselectivity results are thus better than in the sintering process described above, in which closure of the smaller pores is preferred.

The effect of homogeneous CVD which follows activation is again illustrated in FIGS. 1 and 2, in terms of the differential and integral pore size distribution functions. In these figures comparison should be made between the activated membrane stance (2) and the subsequent homogeneous CVD state (4).

Inlayer Deposition

The inlayer effect creates an asymmetric membrane out of an homogeneous membrane. An interesting feature of this mode is its self-curing property: when the pore system is closed at the very thin layer where carbon is deposited, further deposition at that site is stopped and continued in the other more pore-open sites. This provides an autohomogenizing effect during the formation of the very thin inlayer.

Adlayer Deposition

The adlayer also creates an asymmetric membrane out of an homogeneous membrane. However, in terms of the molecular sieving properties the carbon membrane material produced by this process is much different from that of the original matrix, which is typically formed by polymer carbonization.

The experimental conditions at which the CVD is applied enables the preference of any of the three above-mentioned modes, but it is believed that a single mode is not likely to be realized. It is particularly difficult to form an adlayer without initial inlayer formation.

In the following, the means of creating the various CVD deposits will be explained.

i) In order to create a homogeneous layer, provision has to be made to prevent the formation of a superficial dense layer which may block penetration into the depth of the matrix. The safest way to achieve this end is the choice of a small enough decomposing molecule. Slowing down the chemical process by lower temperatures and pressures are other means which help in this respect.

ii) The formation of an inlayer is achieved by selecting a decomposing molecule which partially penetrates the pore system. The very first superficial CVD layer prevents deeper penetration of subsequent decomposing molecules, thus keeping a thin inlayer. The fragments formed during decomposition are small; therefore, they behave as fast penetrants, and may thus precipitate carbon into the depth of the matrix. To minimize this undesirable effect, the fragments should carry as few carbon atoms as possible. This consideration imposes a further constraint on the choice of the chemically decomposing molecule.

In order to form an inlayer as thin as possible, it is desirable that the partial pressure of the decomposing components be progressively decreased across the membrane wall. This requires that the CVD gas be admitted from one side of the membrane, while vacuum is kept at the other side. This also minimizes the problem of the in-depth fragments decomposition.

In order to prevent the formation of an adlayer, the CVD time should be minimized so that the much greater extent of CVD required for adlayer formation (explained below) will be avoided.

iii) Unlike the homogeneous and the inlayer modes where the carbon matrix already exists and only minor filling of pores in the range of molecular size is required from the CVD process, a complete layer of carbon precipitate is necessary in the adlayer case. An adlayer may therefore be significant only if ample time is provided for the process. If the side effects of inlayer formation and deep deposition in the matrix are to be minimized, the decomposing molecule must be considerably larger than the membrane pore size. It is preferred that its smaller and penetrating fragments be low in carbon and, to maintain a vacuum at the other side of the membrane, as explained, for the inlayer CVD mode.

All the above and other characteristics and advantages of the invention will be better understood from the following illustrative and non-limitative examples of preferred embodiments.

DETAILED DESCRIPTION

Activation, as used herein, refers to pore-size opening by partial burnoff in the presence of oxidants from the gaseous phase at elevated temperatures. In the following examples, oxygen in most cases and air in some cases served for this purpose. By this treatment, there remains some oxygen which is bound chemically to the surface of the pores at the carbon membrane. The temperatures applied were 200° C. to 320° C. The treatment with the oxidant is normally followed by treatment in an inert or reducing atmosphere at further higher temperatures, such as hydrogen, argon+5% hydrogen or pure argon or nitrogen. By this last treatment, the carbon loses its chemibound oxygen as the gases carbon dioxide and carbon monoxide so that carbon atoms are also lost from the pore surface, and the pore size is enlarged correspondingly. The temperatures applied for this part of the activation process may range from 300° C. to 1200° C., and are preferably in the range of 500° C. to 800° C. In the following tables, the term "activation" means treatment with an oxidant followed by an inert or reducing gas as mentioned above.

The methods of activation have been previously described in U.S. Pat. No. 4,685,940 and British Patent GB 2,207,666, the specifications of which are incorporated herein by reference, and therefore, the details of the activation steps are not repeated here, for the sake of brevity.

CVD causes a tremendous increase in the selectivities. Activation increases flux, although a substantial drop in selectivity occurs in parallel.

In all examples, the same starting material was employed, which were carbon fibers formed from cellulose hollow fibers (175 µm OD, 150 µm ID) which were carbonized as taught in U.S. Pat. No. 4,685,940. These are denoted $D_2$.

The improving effect of the CVD on the flux-selectivity combination process is best observed by comparing the selectivity values before and after CVD for similar fluxes or the fluxes for similar selectivities, as will become apparent from the following examples.

The gas fluxes through the membrane are given in liters per hour per square meter of membrane area per 1 atmosphere of driving pressure across the membrane wall, namely: liter/(hour-$m^2$-bar).

The positive effect of CVD in the following examples becomes evident by comparing the membrane performance before and after the CVD step. "Performance" implies the permeability of the more permeable components ($O_2$ and $H_2$) and the selectivity (of each of $O_2$ and $H_2$ vis-a-vis $N_2$).

It has been found that it is frequently important to apply the CVD gas at elevated pressures. If the material is a low boiling temperature gas, it is available at a wide range of pressures, and therefore presents no problem in this respect. If, on the other hand the CVD material is liquid or solid at ambient temperature, its pressure of application to the membrane is limited to its vapor pressure. However, as mentioned above, in some cases, e.g., with $CH_3Cl_3$, it is important to apply the CVD material at a high pressure, frequently at a pressure higher than its ambient vapor pressure. One way of achieving this result is to heat up the whole system (storage vessel, connecting tubing, whole membrane module), which is complicated and impractical.

According to a preferred embodiment of the invention, this result is obtained by using a non-permeable CVD material and a permeable carrier gas that passes through a trap containing the volatile CVD material. The CVD-gas mixture is fed to one side of fie membrane, while a vacuum is maintained at the other side. The permeable carrier gas crosses the membrane wall so that the CVD material is purified and concentrated up to the limit where its pressure equals that of the original mixture. Since the temperature under CVD conditions is high, the CVD material remains in the vapor phase.

CVD Systems

FIG. 5 illustrates four different systems useful for carrying out CVD activation. FIG. 5A schematically shows a universal system which can be used both with and without a carrier gas, and in which intermediate permeability measurements (useful to follow membrane development) can be carried out by three different methods. This is the system which was used in the following examples.

Figure 5A:
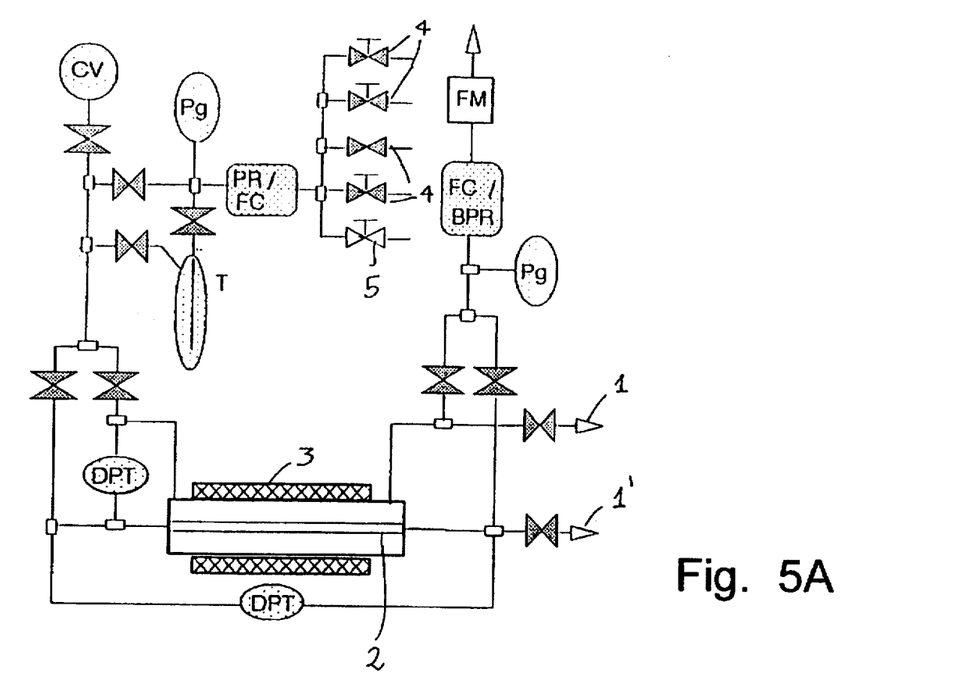
FIGS. 5A, 5B, 5C and 5D schematically shows different configurations of apparatus for effecting CVD.
Figure 5B:
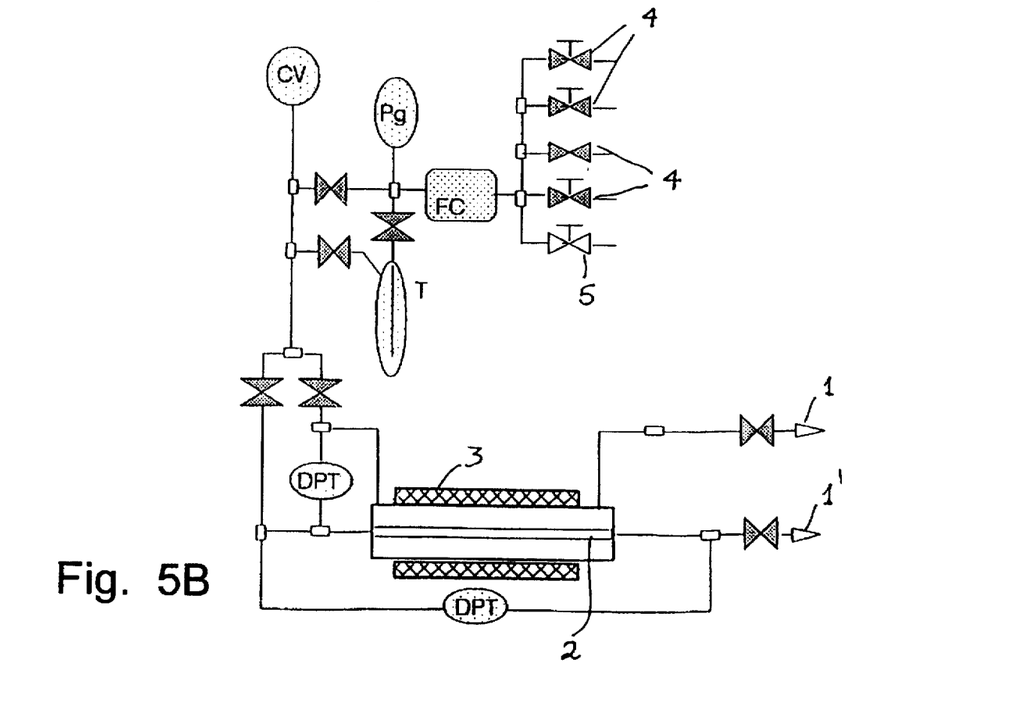
Figure 5C:
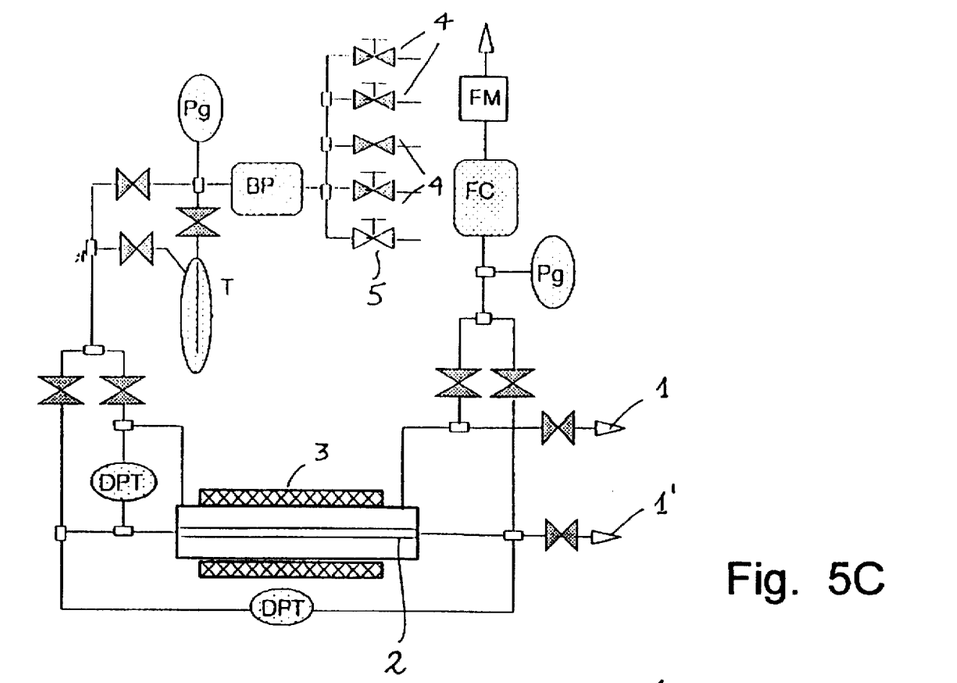
Figure 5D:
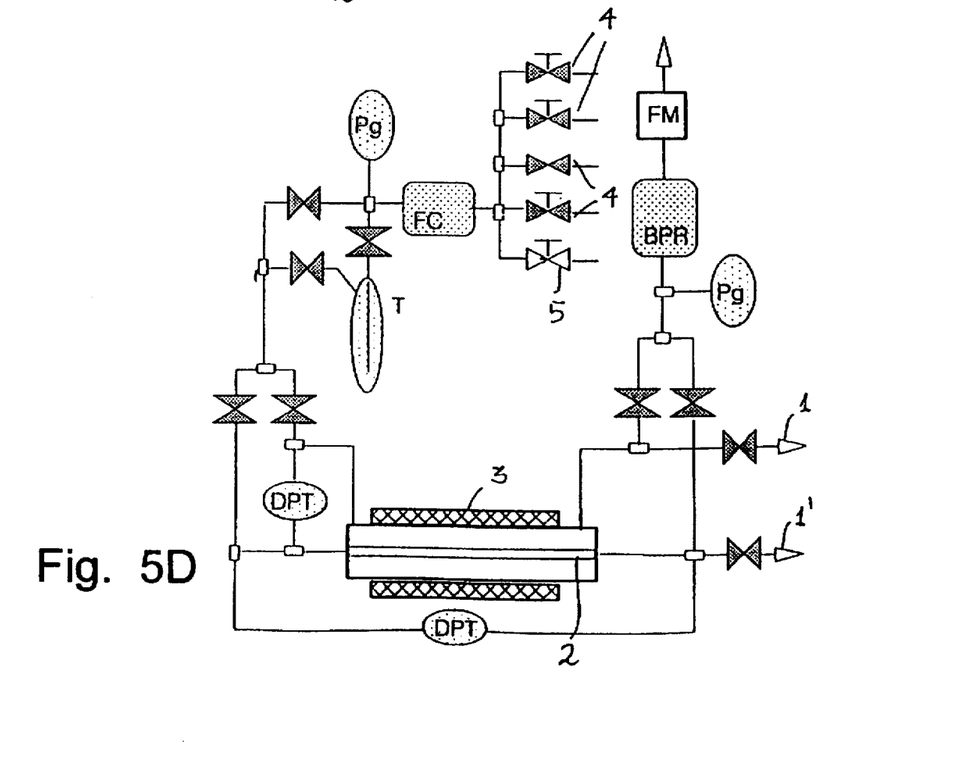

FIGS. 5B–5D illustrate reduced systems, each suitable for a single permeability measurement.

In the figures, the following elements are shown:

T—Trap for liquid CVD material (CVD vapor carried by a gas).

CV—Calibrated Volume

FC—Flow Controller

FM—Flow Meter

DPT—Differential Pressure Transducer

Pg—Pressure gauge

PR—Pressure Regulator

BPR—Back Pressure Regulator

Additionally, arrows 1 and 1' indicate an outlet to ambient, vacuum or gas analyzer; numeral 2 is the hollow fiber; 3 is the oven; 4 is a valve, in a gas manifold; 5 is the valve, for the CVD gas.

Example 1

A module of carbon hollow fiber membranes containing 40 fibers with active length of 30 cm, and having initially low fluxes for the different gases was pre-treated by three activation steps, each composed of an exposure to a flow of $O_2$ at 270° C. for 30 minutes, followed by exposure to $H_2$ at 620° C. for 10 minutes, until its fluxes for the different gases was raised to the values mentioned in line 1 of Table I below. It was then evacuated from both sides of the membrane, then subject, from the bore side only, to a dose of argon saturated at room temperature with 1-1-1 trichloroethane, while the shell side was still connected to the vacuum line.

The exposure to the CVD mixture started at room temperature and was heated up to 620° C. within 5 minutes. Immediately after reaching 620° C., the CVD gas mixture was pumped out, pure argon was introduced, and the membrane module was cooled down to room temperature. The operation of this system is schematically shown in FIG. 5, as described above. The CVD material is fed at one end of the membrane module contained in oven 3, and flows through the hollow fiber 2 contained therein. Vacuum is applied at the other end of the tube. Alternatively, the CVD material can be introduced at the shell side, or both at the shell and bore sides. These alternative modes are not shown in the figures, for the sake of brevity, as they are apparent to the skilled engineer.

The fluxes measured immediately after the CVD are shown in line 2 of Table I, indicating a tremendous increase in the selectivity and a corresponding drop in $O_2/N_2$ and $H_2/N_2$ fluxes. Two subsequent activation steps were made with oxygen at 250° C. for thirty minutes, each followed with treatment in a mixture of 5% hydrogen in argon at 620°

C. for twenty minutes, yielded higher permeabilities at the expense of selectivities.

By comparing the data in line 1 with those of line 3 for hydrogen/nitrogen separation and with line 4 for oxygen/nitrogen separation, the increase in the membrane performance becomes evident.

TABLE I

| treatment | | flux | | | selectivity | |
|---|---|---|---|---|---|---|
| | | l-hour$^{-1}$-m$^{-2}$-bar | | | | |
| No. | type | O$_2$ | N$_2$ | H$_2$ | O$_2$/N$_2$ | H$_2$/N$_2$ |
| 1 | | 750 | 480 | 1380 | 1.6 | 2.9 |
| 2 | CVD | 1 | <.5 | 140 | >2 | >280 |
| 3 | act. | 140 | 14 | 1350 | 10 | 97 |
| 4 | act. | 570 | 140 | 1750 | 4.1 | 12.5 |

Example 2

A module was prepared for CVD as in Example 1. 2,2-Dimethylpropane was used as the CVD material applied at the bore side at a pressure of 1 bar without a carrier gas. It was applied upon heating the sample from 600° C. up to 700° C. Then the process was stopped by pumping out as described in Example 1. The results are shown in Table II.

TABLE II

| treatment | | flux | | | selectivity | |
|---|---|---|---|---|---|---|
| | | l-hour$^{-1}$-m$^{-2}$-bar | | | | |
| No. | type | O$_2$ | N$_2$ | H$_2$ | O$_2$/N$_2$ | H$_2$/N$_2$ |
| 1 | act. | 226 | 61 | 910 | 3.7 | 15 |
| 2 | CVD | <.5 | <.5 | 201 | — | >400 |
| 3 | act. | 68 | 5 | 1213 | 13.6 | 242 |
| 4 | act. | 310 | 45 | 2100 | 6.9 | 47 |
| 5 | act. | 840 | 247 | 2380 | 3.4 | 9.6 |

Example 3

Operating as in Example 1, except that there were two CVD-activation cycles instead of one. The results shown in Table III were obtained.

TABLE III

| treatment | | flux | | | selectivity | |
|---|---|---|---|---|---|---|
| | | l-hour$^{-1}$-m$^{-2}$-bar | | | | |
| No. | type | O$_2$ | N$_2$ | H$_2$ | O$_2$/N$_2$ | H$_2$/N$_2$ |
| 1 | — | 1006 | 721 | 2003 | 1.4 | 2.78 |
| 2 | CVD | 180 | 18 | 960 | 10 | 53 |
| 3 | act. | 1320 | 780 | 2400 | 1.7 | 3.08 |
| 4 | CVD | 140 | 10 | 1570 | 14 | 157 |
| 5 | act. | 870 | 180 | 2420 | 4.8 | 13.4 |

Example 4

Example 1 was repeated, but the CVD step was split into two steps: exposure to the CVD mixture was made only to 450° C. and continued at this temperature for two minutes, then a 5% H$_2$ in argon mixture was introduced, and the membrane cell was heated up to 700° C. and removed at this temperature for two minutes. In this case the permeabilities are higher immediately after CVD, so that it takes fewer activation steps to increase it; thus, the sacrifice of selectivity is reduced, and the process is made simpler due to the smaller number of treatment steps. The results are shown in Table IV.

TABLE IV

| treatment | | flux | | | selectivity | |
|---|---|---|---|---|---|---|
| | | l-hour$^{-1}$-m$^{-2}$-bar | | | | |
| No. | type | O$_2$ | N$_2$ | H$_2$ | O$_2$/N$_2$ | H$_2$/N$_2$ |
| 1 | — | 540 | 330 | 1120 | 1.66 | 3.4 |
| 2 | CVD | 260 | 47 | 980 | 5.5 | 20.8 |
| 3 | act. | 720 | 390 | 1400 | 1.9 | 3.6 |

Example 5

Figure 3:
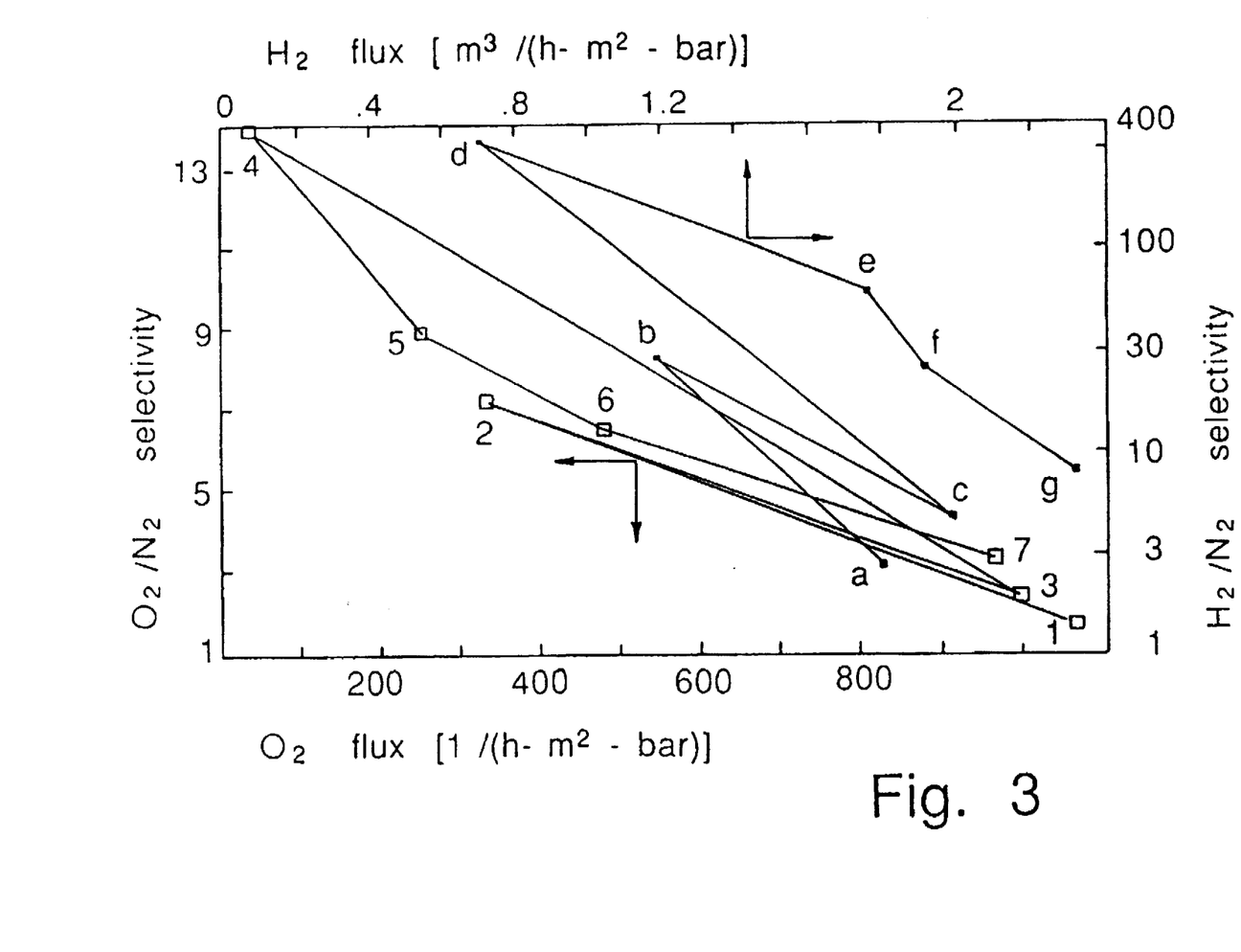
FIG. 3 shows the results obtained in Example 5.

Example 4 was repeated, but the CVD was made at 480° C. rather than at 450° C., and heating of the membrane module after the CVD at 480° C. was made up to 800° C. instead of 700° C. As in Example 3, there were two CVD-activation cycles in this case, which improves the permselectivity twice. The results are shown in Table V and FIG. 3.

TABLE V

| treatment | | flux | | | selectivity | |
|---|---|---|---|---|---|---|
| | | l-hour$^{-1}$-m$^{-2}$-bar | | | | |
| No. | type | O$_2$ | N$_2$ | H$_2$ | O$_2$/N$_2$ | H$_2$/N$_2$ |
| 1 | — | 1070 | 660 | 1810 | 1.64 | 2.7 |
| 2 | CVD | 331 | 40 | 1190 | 8.28 | 29.8 |
| 3 | act. | 1000 | 410 | 1990 | 2.42 | 4.8 |
| 4 | CVD | 30 | 2 | 710 | 15 | 355 |
| 5 | act. | 250 | 28 | 1770 | 8.9 | 63.2 |
| 6 | act. | 480 | 74 | 1920 | 6.5 | 26 |
| 7 | act. | 970 | 290 | 2330 | 3.38 | 8.0 |

Example 6

Example 3 was repeated, but the CVD was introduced at lower initial permeabilities and was applied in one step, starting at room temperature and ending at 620° C., with heat-up time lasting about 5 minutes. The results are reported in Table VI below.

TABLE VI

| treatment | | flux | | | selectivity | |
|---|---|---|---|---|---|---|
| | | l-hour$^{-1}$-m$^{-2}$-bar | | | | |
| No. | type | O$_2$ | N$_2$ | H$_2$ | O$_2$/N$_2$ | H$_2$/N$_2$ |
| 1 | act. | 440 | 150 | 1110 | 2.84 | 7.4 |
| 2 | CVD | 3 | 3 | 350 | 1 | 118 |
| 3 | act. | 520 | 130 | 1510 | 3.87 | 11.6 |
| 4 | act. | 880 | 440 | 2030 | 2.0 | 4.6 |
| 5 | CVD | 5 | 4 | 200 | 1.1 | 50 |
| 6 | act. | 280 | 38 | 1700 | 7.5 | 44.7 |
| 7 | act. | 550 | 120 | 1910 | 4.7 | 15.9 |

Example 7

Example 3 was repeated, but the activation steps were made for a shorter time, namely 10–15 minutes, and at temperatures as high as 320° C. The final selectivities and permeabilities obtained were very high. The results are seen in Table VII below.

TABLE VII

| treatment | | flux | | | selectivity | |
|---|---|---|---|---|---|---|
| | | l-hour$^{-1}$-m$^{-2}$-bar | | | | |
| No. | type | $O_2$ | $N_2$ | $H_2$ | $O_2/N_2$ | $H_2/N_2$ |
| 1 | act. | 770 | 270 | 1860 | 2.8 | 6.9 |
| 2 | CVD | 43 | 5.9 | 2130 | 7.3 | 36.1 |
| 3 | act. | 1460 | 570 | 4440 | 2.58 | 7.7 |
| 4 | CVD | 140 | 2 | 410 | 70 | 205 |
| 5 | act. | 130 | 11 | 1990 | 12 | 181 |
| 6 | act. | 1410 | 370 | 4970 | 3.8 | 13.4 |

Example 8

Example 3 was repeated, but the first CVD step was terminated at 550° C. and the second at 700° C. instead of 620° C. The results are shown in Table VIII.

TABLE VIII

| treatment | | flux | | | selectivity | |
|---|---|---|---|---|---|---|
| | | l-hour$^{-1}$-m$^{-2}$-bar | | | | |
| No. | type | $O_2$ | $N_2$ | $H_2$ | $O_2/N_2$ | $H_2/N_2$ |
| 1 | act | 387 | 116 | 1099 | 3.3 | 9.5 |
| 2 | CVD | 5 | .5 | 327 | 10 | 654 |
| 3 | act | 65 | 7 | 782 | 9 | 112 |
| 4 | act. | 309 | 60 | 1205 | 5.1 | 20 |
| 5 | act. | 760 | 334 | 1648 | 2.3 | 4.9 |
| 6 | CVD | .5 | .2 | 67 | 2.5 | 335 |
| 7 | act. | 13 | 1.7 | 698 | 7.5 | 410 |
| 8 | act. | 91 | 8.8 | 1357 | 10 | 15 |
| 9 | act. | 302 | 39 | 1820 | 7.8 | 47 |
| 10 | act. | 634 | 120 | 2156 | 5.3 | 18 |

Example 9

Example 3 was repeated, but the carrier gas in the CVD mixture was hydrogen instead of argon. A very high hydrogen permeability and selectivity towards nitrogen were obtained, as shown in Table IX.

TABLE IX

| treatment | | flux | | | selectivity | |
|---|---|---|---|---|---|---|
| | | l-hour$^{-1}$-m$^{-2}$-bar | | | | |
| No. | type | $O_2$ | $N_2$ | $H_2$ | $O_2/N_2$ | $H_2/N_2$ |
| 1 | act. | 432 | 116 | 1340 | 3.3 | 12 |
| 2 | CVD | <1 | <1 | 152 | — | >150 |
| 3 | act. | 57 | <1 | 1120 | >57 | >1120 |
| 4 | act. | 238 | 25 | 1680 | 9.4 | 67 |
| 5 | act. | 737 | 146 | 2380 | 5.1 | 16 |

Example 10

The CVD process with 1-1-1 trichloroethylene converts an homogeneous to an asymmetric membrane. This was demonstrated by cooling the membrane cell to liquid nitrogen temperature (77K) and admitting nitrogen doses from both sides of the membrane. At this temperature, absorption of nitrogen is very substantial, and it occurs into the pore system if the adsorbate molecular size is smaller than the pore size (adsorption is experimentally observed by the uptake of gas from the gaseous phase).

Before the CVD process, the adsorption of nitrogen at 77K was substantial and fast if introduced from either side. However, after CVD nitrogen adsorption was still possible, but only if admitted to the shell side of the membrane. This indicates that the pores on that side are large enough to be permeable to the nitrogen molecule. Admission through the bore side, where the CVD carbon film was formed, did not lead to any measurable uptake, indicating that due to the CVD, the pores of that side had become impermeable to nitrogen at this temperature. This is clear evidence that a film of pores narrower than the molecular size of nitrogen was formed at the bore side.

The permeabilities and selectivities (at room temperature) of this membrane before and after CVD are shown in Table X below. The two measured isotherms of FIG. 4 were taken after activation, and after CVD respectively, as described in Table X below.

TABLE X

| treatment | | flux | | | selectivity | |
|---|---|---|---|---|---|---|
| | | l-hour$^{-1}$-m$^{-2}$-bar | | | | |
| No. | type | $O_2$ | $N_2$ | $H_2$ | $O_2/N_2$ | $H_2/N_2$ |
| 1 | act. | 790 | 250 | 1650 | 3.10 | 6.59 |
| 2 | CVD | 50 | 8 | 350 | 6.3 | 43.6 |

Example 11

Figure 4:
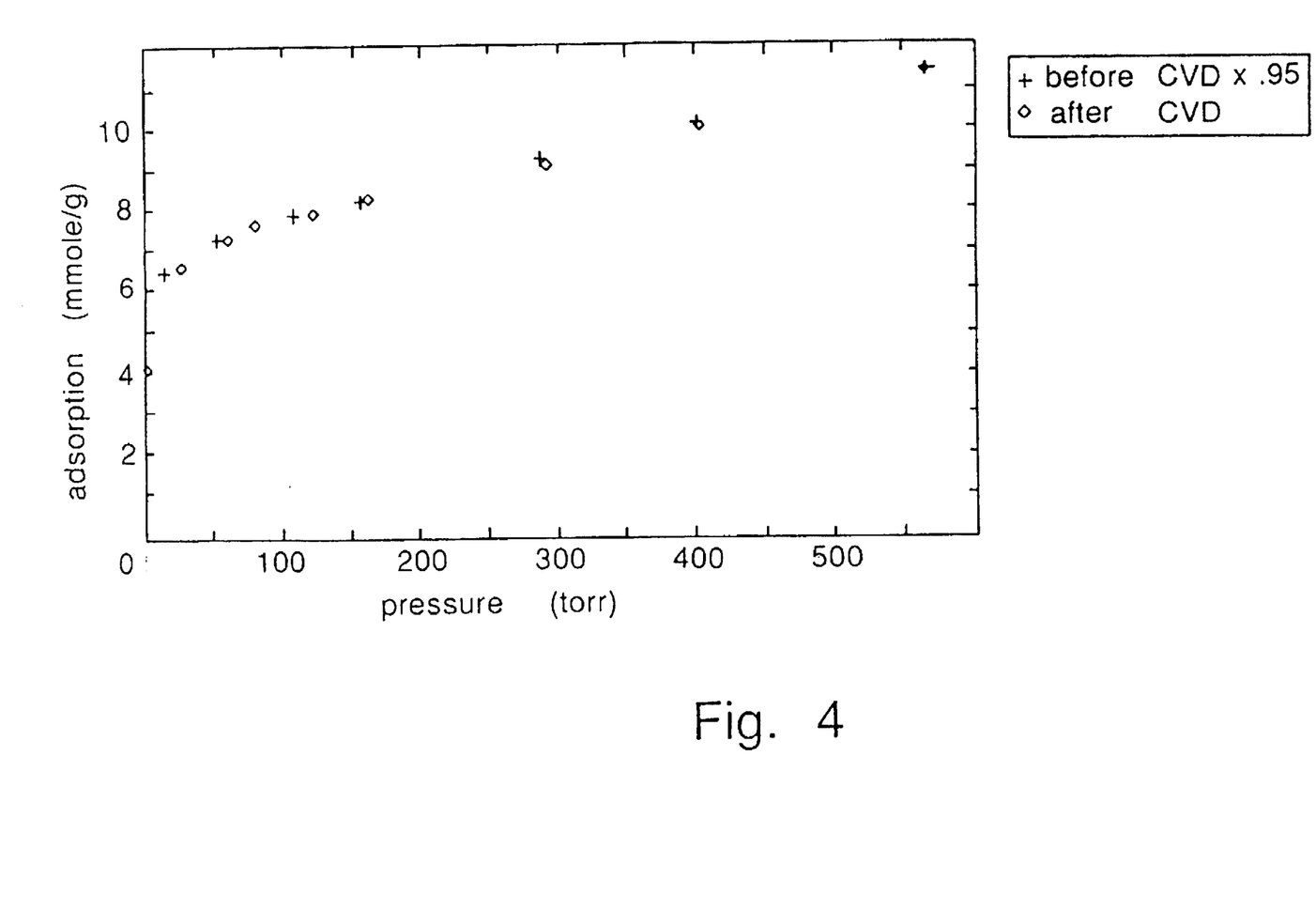
FIG. 4 shows the results obtained in Example 10.

The same adsorption tests to examine asymmetry were carried out as in Example 10 on a different module. But the CVD for this module was performed with 2,2-dimethylpropane as in Example 2. The permeabilities and selectivities are shown in Table XI below, and the nitrogen adsorption isotherms at 77K, admitted from the shell side before and after CVD are shown in FIG. 4. The isotherm before CVD was taken after step 6 in the table and the one after CVD was taken after step 7. As in Example 10, there was no adsorption when the gas was admitted from the bore side from which the CVD gas was introduced. The 12% decrease in the isotherm after CVD indicates that the inlayer film thickness in this particular case was 8×12/100=0.96 micrometers, whereas the original membrane wall thickness was 8 micrometers.

TABLE XI

| treatment | | flux | | | selectivity | |
|---|---|---|---|---|---|---|
| | | l-hour$^{-1}$-m$^{-2}$-bar | | | | |
| No. | type | $O_2$ | $N_2$ | $H_2$ | $O_2/N_2$ | $H_2/N_2$ |
| 1 | act. | 1289 | 450 | 2650 | 2.8 | 5.9 |
| 2 | CVD | 100 | 10 | 1200 | 8.9 | 120 |
| 3 | act. | 230 | 30 | 1760 | 7.35 | 59 |
| 4 | act. | 470 | 70 | 2000 | 6.4 | 28.5 |
| 5 | act. | 770 | 140 | 2300 | 5.4 | 16.5 |
| 6 | act. | 1300 | 340 | 3150 | 3.77 | 9.2 |
| 7 | CVD | 140 | 17 | 1570 | 8.2 | 92 |

Example 12

Example 1 was repeated, but the carrier gas was saturated with the CVD material at 0° C. rather than at room temperature. Therefore, its partial vapor pressure and thus its concentration is lower than the room temperature saturation case. The results obtained are shown in Table XII below.

TABLE XII

| treatment | | flux | | | selectivity | |
|---|---|---|---|---|---|---|
| | | 1-hour$^{-1}$-m$^{-2}$-bar | | | | |
| No. | type | $O_2$ | $N_2$ | $H_2$ | $O_2/N_2$ | $H_2/N_2$ |
| 1 | act | 359 | 125 | 970 | 2.8 | 8 |
| 2 | CVD | <.5 | <.5 | 233 | — | >466 |
| 3 | act. | 69 | 5 | 1181 | 14 | 236 |
| 4 | act. | 239 | 38 | 1876 | 6 | 52 |

Example 13

Example 1 was repeated, but with hydrogen as the carrier for the 1-1-1 trichloroethane CVD material. The very high $H_2/N_2$ selectivity combined with high $H_2$ flux obtained after the first activation step following CVD (line 3 in Table XIII below) is noteworthy.

TABLE XIII

| treatment | | flux | | | selectivity | |
|---|---|---|---|---|---|---|
| | | 1-hour$^{-1}$-m$^{-2}$-bar | | | | |
| No. | type | $O_2$ | $N_2$ | $H_2$ | $O_2/N_2$ | $H_2/N_2$ |
| 1 | act. | 432 | 130 | 1400 | 3.3 | 11 |
| 2 | CVD | <.5 | <.5 | 152 | — | >300 |
| 3 | act. | 57 | <.5 | 1120 | >144 | >2240 |
| 4 | act. | 238 | 25 | 1680 | 9.4 | 67 |
| 5 | act. | 737 | 146 | 2380 | 5.1 | 16 |

Example 14

Combined inert heat-up for activation and CVD.

It was shown in Example 4 that the CVD may be divided into two steps: exposure to the CVD mixture at a mildly elevated temperature which we may denote by C, followed by heat-up in an inert atmosphere (denoted by H). It is known in the art that the activation steps are similarly divided into a step of exposure to the oxidant, which is denoted by O, followed by heat-up in an inert atmosphere (again denoted H). The activation-CVD-activation sequence of the previous examples assumes the form OHCHOH if detailed into the substeps. In this example the two heat-up steps, that of the CVD and that of the activation are combined so as to lead to the sequence OHOCH, as shown in Table XIV below.

The molecular implementation of this mode is that the CVD falls over an oxidized surface, so that during heat-up in the inert atmosphere there is both pore opening by the removal of carbon oxides and pore closure by CVD, with the net result of some improvement in the permselectivity.

In order to appreciate the improvement in the permselectivity, data prior to the activation step (line 2) which preceded CVD (line 3) are also provided in line 1 in the table. Comparing the oxygen flux and the $O_2/N_2$ selectivity between lines 1 and 3, the improvement is clearly evident.

TABLE XIV

| treatment | | flux | | | selectivity | |
|---|---|---|---|---|---|---|
| | | 1-hour$^{-1}$-m$^{-2}$-bar | | | | |
| No. | type | $O_2$ | $N_2$ | $H_2$ | $O_2/N_2$ | $H_2/N_2$ |
| 1 | — | 112 | 19 | 1797 | 5.9 | 95 |
| 2 | OH | 1334 | 639 | — | 2.1 | — |
| 3 | OCH | 492 | 80 | 2800 | 6.2 | 35 |

The above descriptions and examples have been provided for the purpose of illustration and are not intended to limit the invention in any way. Many modifications can be effected in the CVD method, including, e.g., different systems, carrier gases, CVD materials and membranes, all without exceeding the scope of the invention.

We claim:

1. A process for manufacturing an asymmetric carbon membrane from symmetric carbon membranes, said symmetric carbon membrane comprising hollow fibers having pores, said carbon membrane having a shell side and a bore side, said process comprising the steps of:
    (a) causing a stream of pyrolysable carbon-containing gas having a molecular size greater than the pore size of said hollow fibers to come into contact with either said shell side or said bore side of said symmetric carbon membrane and to be adsorbed thereto;
    (b) raising and maintaining the temperature of said symmetric membrane to or above said temperature at which said gas pyrolyzes, whereby to pyrolyze said gas adsorbed thereby;
    (c) substantially purging the atmosphere surrounding the membrane from any carbon-containing gas;
    (d) cooling the membrane; and
    (e) partially opening said pores of said hollow fibers by partial burn-off in the presence of an inert gas or oxidant;
thereby obtaining said asymmetric membrane.

2. A process according to claim 1, further comprising the steps of:
    f) further partially opening the pores by partial burn-off in the presence of oxidant; and
    g) checking the membrane permeability and selectivity at any selected time or temperature.

3. A process according to claim 1, wherein the pyrolysable carbon-containing gas is applied from the bore side of the hollow fiber only, keeping an inert atmosphere or a vacuum at the shell side.

4. A process according to claim 1, wherein the pyrolysable carbon-containing gas is mixed with a carrier gas.

5. A process according to claim 4, wherein the carrier gas is permeable towards the membrane and the pyrolysable carbon-containing gas material is non-permeable.

6. A process according to claim 5, wherein the pressure of the gas mixture is higher than the vapor pressure of the pyrolysable carbon-containing gas.

7. A process according to claim 1, wherein the process steps are carried out in any order chosen from: a-b-c-d, b-a-c-d, a-b-d-c, or b-a-d-c.

8. A process according to claim 1, wherein the pyrolysable carbon-containing gas is neopentane or trichloroethane.

9. A process according to claim 2, further comprising the step of:
    repeating one or more of steps a) through e) and/or f) to achieve a desired permeability/selectivity combination.

* * * * *